(12) United States Patent
Codama

(10) Patent No.: US 7,087,962 B1
(45) Date of Patent: Aug. 8, 2006

(54) METHOD FOR FORMING A MOS TRANSISTOR HAVING LIGHTLY DOPPED DRAIN REGIONS AND STRUCTURE THEREOF

(75) Inventor: Mitsufumi Codama, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 08/433,561

(22) Filed: May 3, 1995

Related U.S. Application Data

(60) Continuation of application No. 08/173,078, filed on Dec. 27, 1993, now abandoned, which is a division of application No. 07/990,288, filed on Dec. 14, 1992, now Pat. No. 5,292,675.

(30) Foreign Application Priority Data

Dec. 24, 1991 (JP) .............................................. 3-356299

(51) Int. Cl.
*H01L 27/01* (2006.01)
*H01L 29/76* (2006.01)
*H01L 29/04* (2006.01)
*H01L 27/12* (2006.01)
*H01L 29/94* (2006.01)

(52) U.S. Cl. ........................... 257/347; 257/66; 257/72; 257/350; 257/351; 257/352; 257/344; 257/408

(58) Field of Classification Search ................. 257/57, 257/59, 66, 72, 347, 350, 351, 352, 353, 257/336, 344, 408
See application file for complete search history.

(56) References Cited

U.S. PATENT DOCUMENTS

| | | | |
|---|---|---|---|
| 4,319,395 A | 3/1982 | Lund et al. ..................... 437/41 |
| 4,757,026 A * | 7/1988 | Woo et al. ..................... 257/408 |
| 4,897,361 A | 1/1990 | Harriott et al. ................ 437/24 |
| 4,946,799 A | 8/1990 | Blake et al. .................... 437/41 |
| 4,951,601 A | 8/1990 | Maydan et al. .............. 118/719 |
| 5,162,892 A * | 11/1992 | Hayashi et al. ................. 257/66 |
| 5,962,870 A | 10/1999 | Yamazaki et al. | |
| 6,011,277 A * | 1/2000 | Yamazaki ..................... 257/66 |

FOREIGN PATENT DOCUMENTS

| | | | |
|---|---|---|---|
| JP | 54070762 | 6/1979 | .................. 437/44 |
| JP | 57-102067 | * 6/1982 | .................. 257/350 |
| JP | 59-161870 | * 9/1984 | .................. 257/344 |
| JP | 59-161870 | 12/1984 | |
| JP | 60-055665 | 3/1985 | |
| JP | 62-174973 | 7/1987 | |
| JP | 63-204769 | 8/1988 | |
| JP | 01-125866 | 5/1989 | |
| JP | 02-098143 | 4/1990 | |
| JP | 2-159730 | 6/1990 | |
| JP | 2-237037 | 9/1990 | .................. 257/344 |
| JP | 03-020046 | 1/1991 | |
| JP | 05-047791 | 2/1993 | |

* cited by examiner

*Primary Examiner*—Steven Loke
(74) *Attorney, Agent, or Firm*—Nixon Peabody, LLP; Jeffrey L. Costellia

(57) ABSTRACT

A MOS transistor having a LDD structure is described. In accordance with the present invention a MOS transistor includes a low impurity concentration region formed in a semiconductor film between an end of a gate electrode and a source or drain. The transistor includes an insulating film extending beyond the gate electrode in the direction of the source and drain, the insulating film having a thicker portion over the channel region of the semiconductor film and a thinner portion over the source and drain regions of the semiconductor film, such that LDD regions can be formed by utilizing the thickness difference between the thick portion of the insulating film and the thin portion of the insulating.

43 Claims, 5 Drawing Sheets

METHOD FOR FORMING A MOS TRANSISTOR HAVING LIGHTLY DOPPED DRAIN REGIONS AND STRUCTURE THEREOF

This application is a Continuation of Ser. No. 08/173,078, filed Dec. 27, 1993, now abandoned; which itself is a division of application Ser. No. 07/990,288, filed Dec. 14, 1992, now U.S. Pat. No. 5,292,675, issued Mar. 8, 1994.

BACKGROUND OF THE INVENTION

1. Field of the Invention

The present invention relates to a method for preparing a thin-film transistor which is used mainly in a liquid crystal display of an active matrix driving system, an image sensor, a thermal head and the like, and relates to a thin-film transistor obtained by this preparing method. The present invention can be also applicable to MOS transistor to be used for LSI.

2. Description of the Related Art

Up to this time, a thin film transistor (hereinafter referred to as TFT) has been used for a liquid crystal display of a small television set and a computer system, an image sensor used for a facsimile machine, and a thermal head. At present, an amorphous silicon TFT is being most popularly developed, on account of its feature that it can be prepared by a comparatively easy method and it is easy to be formed on a large area substrate. The amorphous silicon TFT, however, has a drawback that the mobility of its electron and hole is very small such as in the order of 1 cm$^2$/V·S and 0.1 cm$^2$/V·S respectively. This drawback causes an insufficient performance especially in switching speed in order to construct a driving circuit on the same substrate, though it does not pose a big problem in switching of e.g., each one pixel of a liquid crystal display or each bit of an image sensor.

On the other hand, a polycrystal silicon TFT being used in a small type liquid crystal television or an image sensor, has about 10 cm$^2$/V·S or more of both mobilities of electron and hole, and the product actually constructed with the driving circuit has been on sale. This polycrystal silicon TFT usually has a coplanar type structure, namely; the structure that each electrode of gate, source, and drain is all positioned opposite the substrate toward a silicon channel part.

In case of such TFT as the above structure, an impurity introduction into a semiconductor film of source and drain part will be usually carried out by such method as ion implantation, ion doping, and plasma doping, using a self-alignment with the mask of gate electrode. Further, an activation of impurity will be effected by heat-annealing or laser-annealing at the temperature of 600° C. or more, and after that, TFT will be finally prepared by forming an interlayer insulating film and a metal wiring and so on.

Such prepared coplanar type TFT has a structure in which an impurity region is provided in a positioning relation as shown in FIG. 2(*a*). In this structure, high-density doping layers 20 and 21 are provided just beside a gate electrode 22/a gate insulating film layer 23, or one part thereof is provided overlapping with the gate electrode. For that reason, when such TFT is operated, an electric field is concentrated in the vicinity of the drain 20 to generate so-called hot carriers. This causes degradation of linearity of mutual conductance (Gm) and inconvenience that the reliability is lowered by degradation of a device characteristic such as degradation of mutual conductance (Gm) in a long period use. Furthermore, there occurs a degradation that an electric current will be easily leaked through a center area level of band gaps existing in the neighborhood of the drain 20.

As a solving means for the above-mentioned inconveniences, LDD (Light doped drain) structure has been adopted in LSI, and also it has been investigated in TFT recently and adopted partly. A preparing method for TFT of such structure takes the following steps;

(1) Firstly, a gate silicon oxide film 23 and a silicon film 22 doped with an impurity in a high concentration will be formed on a silicon which is patterned in an island state. Then, a gate electrode and a gate silicon oxide film will be formed by patterning these films. After an impurity is introduced into an island state silicon part (source 21, drain 20), where is not covered with the gate electrode 22, in a low concentration of 10$^{17}$ to 10$^{19}$ atoms/cm$^3$, a silicon oxide film 24 will be formed using a film-forming method with a good step-coverage, thereby obtaining the state of FIG. 2(*b*). At this time, in the side wall of the gate part, silicon oxide film will be accumulated thickly.

(2) Then, by etching this silicon oxide film 24 using such high anisotropic etching method as RIE (Reactive Ion Etching), the silicon oxide film 25 will be remained in the neighborhood of side area of the gate electrode 22. In this way, the state of FIG. 2(*c*) will be obtained. The thick film part on side area of this gate electrode will be used as a spacer for the later doping.

(3) Next, using the above prepared silicon oxide film 25 (Spacer for doping) neighboring the gate electrode 22 as a mask, an ion implantation of impurity will be executed in a high, concentration (10$^{20}$ to 10$^{21}$ atoms/cm$^3$). After that, source 28 and drain 27 will be completed by activating the impurity, and also LDD part 28 where the impurity is introduced in a low concentration will be completed, under the silicon oxide film 25 nearby the gate electrode 22, thus obtaining the state of FIG. 2(*d*). In this way LDD structure can be formed. The above (1) to (3) processes, however, will be added in comparison with the case of preparation for the conventional transistor as shown in FIG. 2(*a*), the result being that it is disadvantageous in the point of yielding and cost.

SUMMARY OF THE INVENTION

Accordingly, it is an object of the present invention to overcome the above-mentioned disadvantage and to provide a method for forming a thin film transistor (MOS transistor) comprising a crystalline silicon and having a stable performance in a high reliability and a high-off resistance, on an insulating substrate, by forming off-set structure or LDD structure without the increasing of photomasks and the addition of film forming processes.

In order to attain the foregoing and other objects, the method for forming a MOS transistor in accordance with the present invention comprises the steps of:

forming a semiconductor film;

forming an insulating film on said semiconductor film;

forming a conductive material on said insulating film;

patterning said conductive material into an island;

removing a portion of said insulating film by etching to leave a portion of said insulating film unremoved under said island and thin a portion of said insulating film outside the unremoved portion of said insulating film;

forming a gate electrode by reducing a width of said island by removing a portion of said island by etching; and introducing an impurity into said semiconductor film with said gate electrode as a mask.

A gate insulating film is formed on said semiconductor film under said gate electrode. The portion of said insulating film outside the unremoved portion of said insulating film is made thinner than the gate insulating film by said removing step.

That is; in place of the spacer in a side area of gate electrode which has been required for the preparation of conventional TFT having LDD structure, a usual gate insulating film will be widely formed extending beyond a gate electrode in a direction along source and drain, and further a thinner insulating film than this gate insulating film will be formed in the side thereof. Then, a region with a low concentration of impurity will be formed, in the semiconductor film part existing between the end part of the gate electrode and the source or drain, by using the thickness difference between the part excepting the gate electrode in the gate insulating film and the thin insulating film in the side thereof.

The present invention will be explained according to FIG. 1 as follows; In the first place, a crystalline silicon active layer 2 of an island state will be formed on an insulating substrate 1 [FIG. 1(a)]. After that, a gate silicon oxide film 3 and a silicon film 4 which constitutes a gate electrode and is doped with impurity in a high concentration will be formed [FIG. 1(b)]. Next, the silicon film 4 will be etched by a high anisotropic etching method to form an outward form of a gate electrode 5 once at least [FIG. 1(c)]. In succession with this process or by changing slightly the etching conditions (such as kind of etching gas, reaction pressure, etching mode, and bias voltage), an etching will be conducted remaining some part of silicon oxide film 3 exposed from the resist-pattern 6 [FIG. 1(d)], thereby forming a thin part 7 on the gate insulating film 3, nearby the both ends of the gate electrode 5. The thin part 7 is thinner than the gate insulating film part 9.

After that, successively or changing the etching conditions, a portion of the gate electrode silicon island will be so removed by the etching method, which has a high selectivity with the silicon oxide film and is isotropic, as to effect an etching in the direction of the side wall of the exposed gate electrode, thus narrowing the channel-width direction of gate electrode, and completing the final form of gate electrode 8 [FIG. 1(e)]. Then, a resist pattern will be removed and the structure shown in FIG. 1(f), which has a thick gate silicon oxide film part 9 around the gate electrode 8 and a thin enough part 7 excepting the part 9, will be formed.

Next, an impurity ion will be implanted into the semiconductor film from the upper of this state through the insulating film 7 and 9 by an ion implantation method etc. [FIG. 1(g)]. At this time, by an impurity implantation using a moderate acceleration voltage and a dose corresponding to the film thickness of each gate silicon oxide, an active layer silicon lying under the thin film part 7 of gate silicon oxide will be densely doped with an impurity, and an under portion of the thick part 9 of gate oxide film will be doped up to the concentration suitable for LDD structure, resulting in that each source part 10 or drain part 11 and LDD part 12 will be formed. Moreover, by setting up to a suitable ratio the film-thickness difference between the removed part and remained part of gate silicon oxide film through an etching it is possible to finish the impurity doping process once at the same time to control the concentration of the impurity introduced into the semiconductor film under the thin part 7 thinner than the gate insulating film part 9 and under the removed portion of the gate electrode silicon island.

An impurity concentration in the silicon semiconductor active layer under the thin film part of the gate silicon oxide insulating film can be rendered larger than that in the silicon semiconductor active layer under the removed portion of the gate electrode silicon island by the implantation (the introduction) of the impurity.

On the other hand, this structure can be also prepared as follows. Namely; in the above-mentioned preparing process, it will be formed by changing the process order of FIG. 1(d) and FIG. 1(e). Firstly, the structure shown in FIG. 1(e) will be gotten by applying an isotropic etching to the gate electrode silicon, sufficiently controlling an over-etching. It is possible to control an undercutting of gate electrode silicon lying right under the resist, by adjusting an isotropic etching time. Then, by continuing an etching of the insulating film 3 using a high anisotropic etching method, a gate silicon oxide in an exposed part from the resist-pattern 6 will be proceeded with an etching, and the structure like FIG. 1(d) can be formed. TFT having LDD structure can be realized by conducting subsequent doping process in the same way as the aforementioned.

In accordance with the present invention, it is possible to form a low concentration impurity region in the semiconductor film part between the end of gate electrode and the source or the drain, by utilizing the thickness difference between the part excepting the gate electrode in the gate insulating film and the thin insulating film at the side thereof.

That is; in case of an ion implantation method which is usually used as a means to introduce an impurity element into a semiconductor film, if the implantation is effected through another film, the implanted concentration in the semiconductor film will change in accordance with the film thickness. This situation is shown in FIG. 4, in which an axis of abscissa represents a thickness of $SiO_2$ film provided on silicon semiconductor, and an axis of ordinate represents a phosphorus concentration on the highest surface of silicon semiconductor. A computer simulation result in case of the ion implantation of phosphorus, employing $5\times10^{15} cm^{-2}$ of dose and 40 KV of acceleration voltage is indicated in FIG. 4, in which a peak is at 400 Å. The peak position moves according to the change of acceleration voltage.

In accordance with the present invention, LDD structure can be easily realized, by using a concentration difference of impurity to be implanted into a semiconductor film, owing to the film-thickness difference on this semiconductor film. Namely; an impurity implantation will be executed through the gate insulating film, the thickness of which will be provided to be thin in the area where is in contact with the source or drain part, and will be provided to be thicker in the part where is close by the end of gate electrode.

In this way, for example, when the film of source or drain part is 300 Å thick, $1\times10^{21} atoms \cdot cm^{-3}$ of an impurity concentration will be implanted into a semiconductor film as seen in FIG. 4. On the other hand, when the insulating film in LDD part is 1000 Å thick as is the same with the gate insulating film, $6\times10^{17} atoms \cdot cm^{-3}$ of an impurity concentration will be implanted into a semiconductor film, as referred to FIG. 4. It is, therefore, possible to implant both high and low concentrations of an impurity into the same semiconductor film at the same time.

It is needed for a conventional preparing method of MOS transistor having LDD structure to increase a forming of silicon oxide film to become a spacer, a dry-etching process thereof, and further a second time doping of impurity, as compared with the preparing method of MOS transistor having no LDD structure. Namely; it is apparent that a vacuum treating process will be increased three times. According to the present invention, the dry-etching processes will be added. But these processes can be carried out, by adding a process not to break the vacuum operation to the conventional preparing process of MOS transistor having no LDD. The process increase is negligibly small, and the impurity doping process can be effected by only one doping. The present invention, therefore, has a big difference and advantage compared with the conventional preparing method for LDD structure.

As described above, in accordance with the method of the present invention, a semiconductor island is formed on a substrate, an insulating layer is formed on the semiconductor island, a gate electrode is formed on a part of the insulating layer, and an impurity is introduced to a portion of the semiconductor island through the insulating layer with the gate electrode as a mask in order to form source and drain regions in the semiconductor island and a channel region therebetween, wherein the insulating layer on the channel region is thicker than that on the source and drain regions and the thicker portion of the insulating layer extends beyond the gate electrode in a direction along the source and drain regions as shown in FIGS. 1(f) and 1(g).

BRIEF DESCRIPTION OF THE DRAWINGS

The objects, features, and advantages of the present invention will become more apparent, from the following description of the embodiments taken in conjunction with the accompanying drawings, in which.

DETAILED DESCRIPTION OF THE PREFERRED EMBODIMENT

The present invention will be explained in more detail, by reference to the following Examples in connection with the drawings. The present invention is by no means limited to the Examples, without departing from the spirit and the scope thereof.

EXAMPLE 1

Figure 1A:
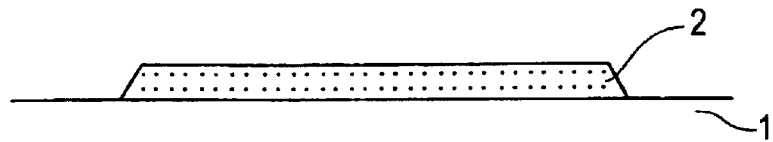
FIGS. 1(a)–1(g) shows a schematic diagram of the preparing method for MOS transistor having LDD structure according to the present invention.
Figure 1B:
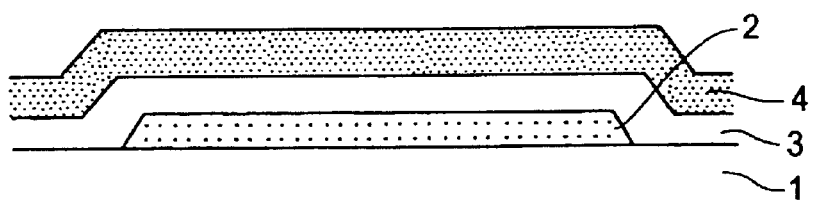

After a passivation film was formed on a glass substrate 1, an amorphous silicon film 2 was formed in 1000 Å thick by LPCVD method, Plasma CVD method and the like. The film 2 was heated at 600° C. for 48 hrs. to effect a solid-growth of an amorphous silicon layer, which was then patterned to be an island-like by a photo-lithography [FIG. 1(a)]. As a gate insulating film, a silicon oxide film 3 was formed in 1000 Å thick by sputtering method, the process of which was carried out in 100% of oxygen gas. Further, an amorphous silicon film containing 1 to $10 \times 10^{20} cm^{-3}$ of phosphorous as a gate electrode was formed by LPCVD or Plasma CVD method etc. A polysilicon film may be formed as the gate electrode in 3000 to 4000 Å thick instead of the amorphous silicon film by LPCVD method [FIG. 1(b)].

Figure 1C:
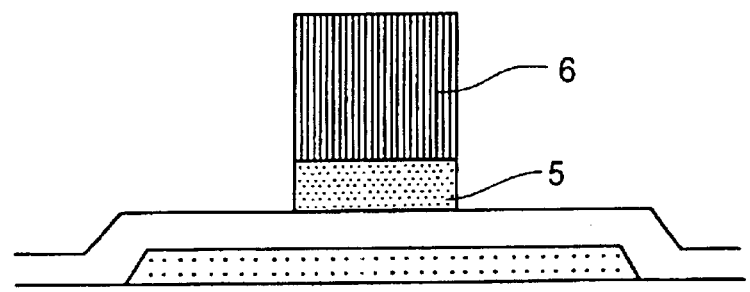
Figure 1D:
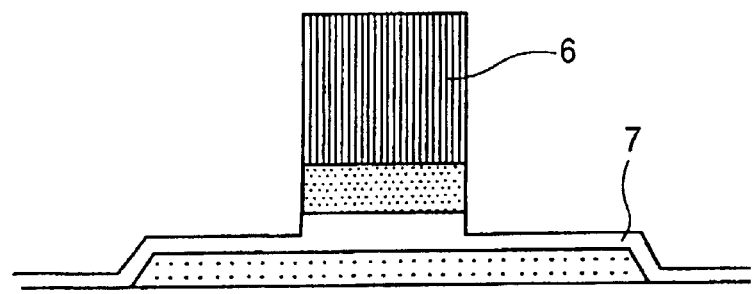

Then, a silicon film 4 was dry-etched, and FIG. 1(c) was obtained. This etching treatment was conducted using a gas of $CF_4+Cl_2$ system, setting up RIE (Reactive Ion Etching) mode condition and keeping the temperature of substrate to be treated at 10° C. or less, preferably at 0° C. This patterning step of the silicon film 4 to become a gate electrode is carried out in vacuum. In succession, a silicon oxide layer 3 was etched in 700 Å thick, replacing the reaction gas with $CF_4+H_2$ system without breaking the vacuum and keeping RIE mode condition. Thus obtained structure is shown in FIG. 1(d). Namely; it shows a structure that a thin part of insulating film 7 is provided at the side of gate insulating film.

As described above, in this Example 1, the patterning step of the silicon film 4 to become a gate electrode and the removing step of the silicon oxide layer 3 as a gate insulating film were carried out sequentially.

Figure 1E:
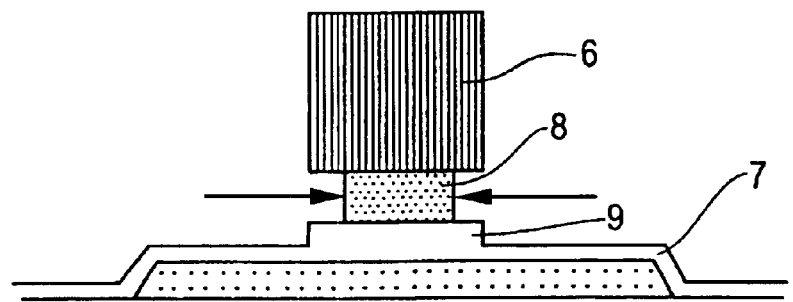
Figure 1F:
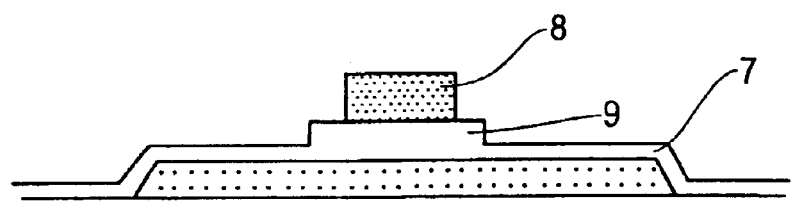

Furthermore, an isotropic plasma etching was effected, replacing the reaction gas with $CF_4+O_2$ system and cooling the substrate to 0° C. without breaking the vacuum as it was. Thereby, an etching of a silicon film 5 was proceeded to form a gate electrode as shown in FIG. 1(e). This is ascribed to that the selection ratio of an exposed silicon oxide layer 7 per a gate electrode silicon film 5 is in a degree of tens. It was also found that since the protective film was deposited on the side wall of gate electrode when the etching of silicon oxide layer was conducted before this plasma etching, an etching reproducibility is more improved by ashing the protective film using an oxygen plasma.

Figure 1G:
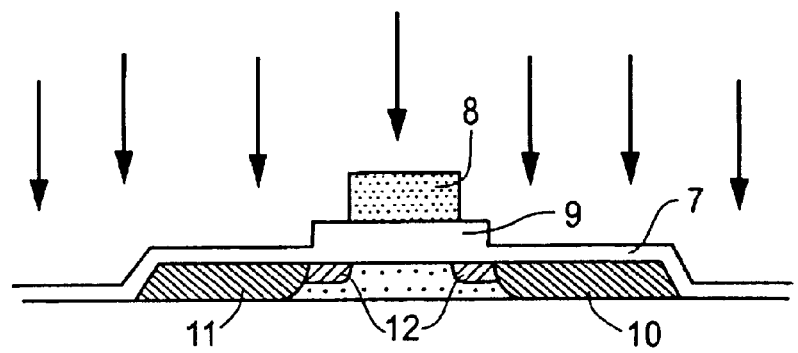
Figure 2A:
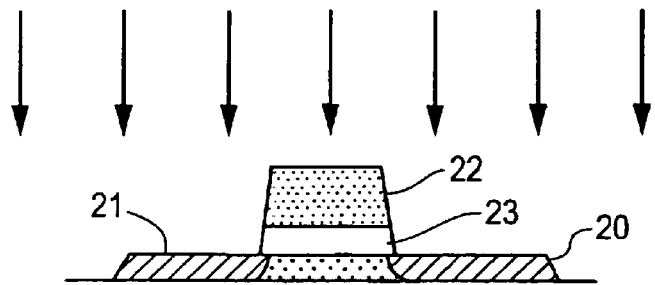
FIGS. 2(a)–2(d) shows a schematic diagram of the conventional preparing method for MOS transistor having LDD structure, and a schematic diagram of the structure thereof.
Figure 2B:
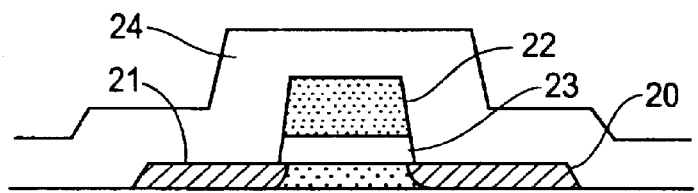
Figure 2C:
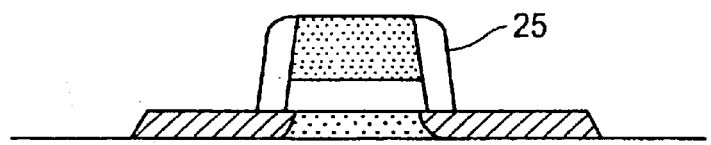
Figure 2D:
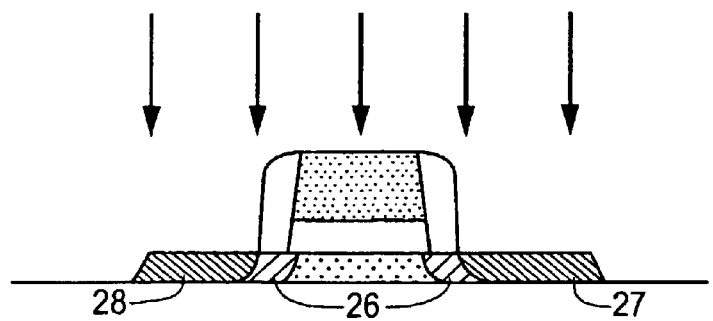

In case of the preparation for NMOS as TFT obtained by removing 3000 Å of a gate electrode in a direction of a width of the gate electrode by etching in accordance with the above-mentioned method, phosphorous (P) was implanted as an impurity ion implantation, setting up $2\times10^{13}$ atoms/cm$^2$ of a dose with e.g., 60 kV of acceleration energy. In succession, the ion implantation of $5\times10^{15}$ atoms/cm$^2$ of a dose with 30 kV of acceleration energy was executed. After that, as an impurity activation process, e.g., 600° C. and 24 hrs. of a heat-annealing was applied, thereby obtaining TFT having such LDD structure as shown in FIG. 1(g).

As a next process, a hydrogen treatment was effected at 400° C. and for 2 hrs. and PSG as an interlayer insulating film was formed in 1 μm thick, and a contact hole was made. Then, TFT having LDD structure was completed by film-forming and patterning of Al electrode. Such prepared TFT had a feature that the leak current between source and drain was reduced by about 2 to 3 figure in $10^{-9}$ A order, and also that a dielectric strength was improved, as the concentration of electric field in the end of drain was lightened and the carrier implantation into the gate silicon oxide film was reduced.

EXAMPLE 2

Figure 3A:
FIGS. 3(a)–3(d) shows an application example of MOS transistor according to the present invention.
Figure 3B:
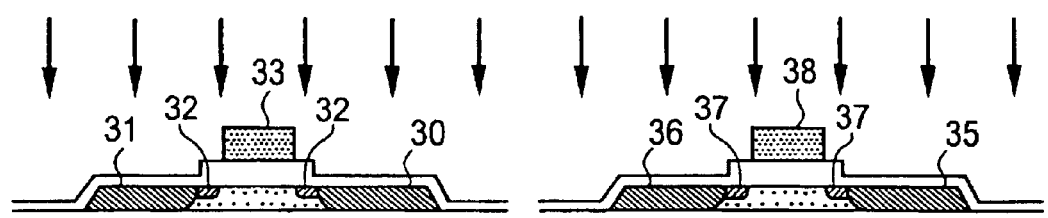
Figure 3C:
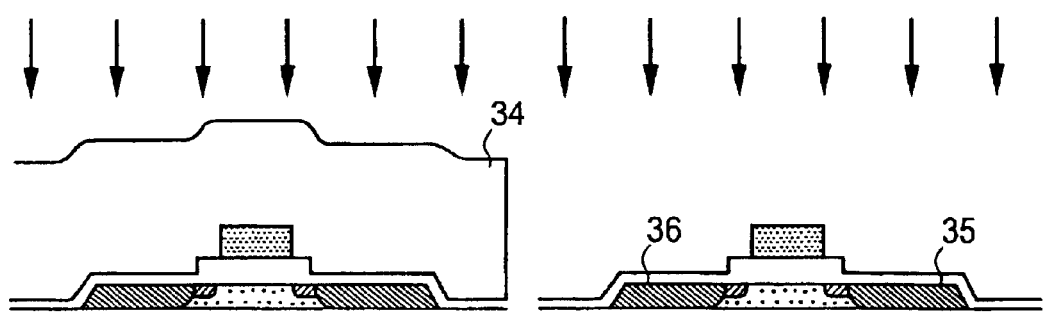
Figure 3D:
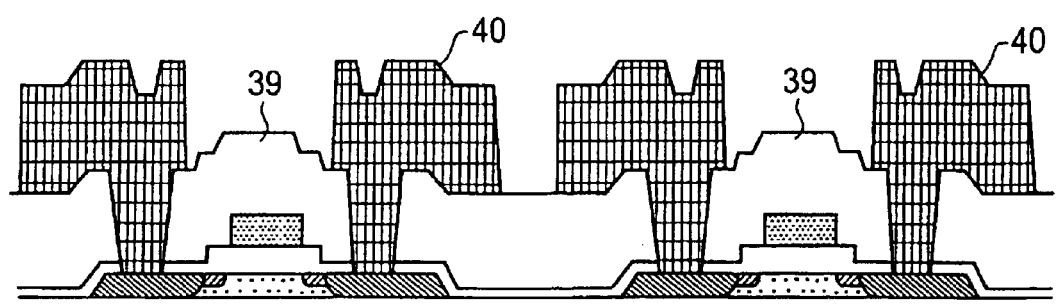
Figure 4:
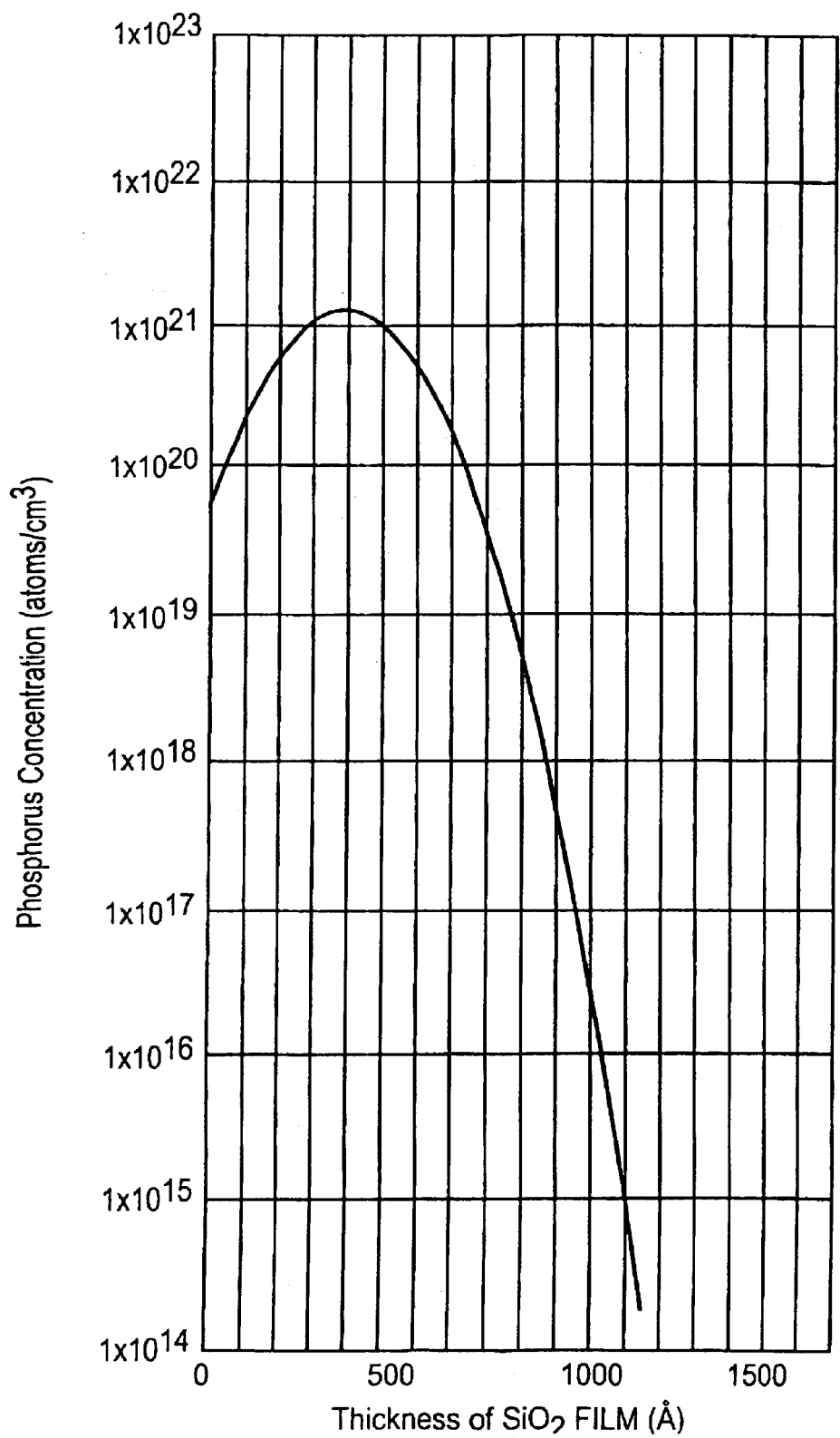
FIG. 4 shows a relationship between the ion concentration and the film thickness according to an ion implantation.

The preparing arrangement for a complementary type MOS is as follows; the structure of FIG. 3(a) was prepared by the preparing process fundamentally according to the above Example 1. Then, boron (B) as an impurity was doped on the whole area, under e.g., 10 kV of acceleration voltage and $1\times10^{15}$ atoms/cm$^2$ of dose, to form a source or a drain part of PMOS 30, 31, and to form LDD 32 nearby the gate electrode 33 at the same time [FIG. 3(b)]. Further, the side of PMOS transistor was covered with resist 34 as shown in FIG. 3(c), and a doping with phosphorous (P) as an impurity was effected, under e.g., 30 kV of acceleration voltage and $5\times10^{15}$ atoms/cm$^2$ of dose. Thereby forming a source or a drain part of NMOS 35, 36, and also forming LDD 37 nearby the gate electrode 38 [FIG. 3(c)].

Next, the resist was removed. After activation at 600° C. for 24 hrs. hydrogen treatment at 400° C. for 2 hrs. was conducted, and as an interlayer insulating film 39, a silicon oxide film was formed in about 1 μm thick by a normal pressure CVD method. Then, a contact hole was made, and a film-forming and a patterning of Al electrode 40 were effected, the result being shown in FIG. 3(*d*). In this way, a complementary type TFT having LDD structure was prepared.

In the above Examples, a single layer material was used as a gate insulating film. This structure, however, is not restrictive, and a gate insulating film having a multi-layer structure laminated with a plural of insulating materials can be also applicable to the present invention. In such case, there arises a difference in the etching degree brought about by a multi-layer of materials, when the etching process of thin insulating film is effected at the side of gate insulating film. It is characterized in that the over-etching can be prevented by the difference.

In the above Examples, the explanation was made using silicon materials as a semiconductor film and an insulating film. The present invention, however, is not especially limited to these materials, but is applicable to other materials and to all the MOS transistor.

In accordance with the present invention, MOS transistor with a simple structure and LDD features can be realized without any increased processes. It is also appreciated that the preparing cost can be reduced, because the number of masks to be used will not be increased.

What is claimed is:

1. An active matrix display device including a thin film transistor for switching a pixel of said display device, said active matrix display device comprising:
   a substrate having an insulating surface;
   a semiconductor layer formed on said insulating surface;
   an insulating film including a gate insulator therein formed on said semiconductor layer, said insulating film having a thicker portion located on and completely covering a channel region of said semiconductor layer, and thinner portions located on source and drain regions of said semiconductor layer, wherein said source and drain regions extend throughout the thickness of the semiconductor layer,
   a gate electrode formed on the thicker portion;
   an interlayer insulating film formed on said insulating film and said gate electrode; and
   at least one electrode formed over said interlayer insulating film for contacting at least one of said source and drain regions,
   wherein first and second LDD regions are formed in said semiconductor layer between the channel region and the source region and between the channel region and the drain region below extending parts of the thicker portion, said extending parts of the thicker portion extending beyond the edges of the gate electrode,
   wherein a concentration of an impurity contained in said source and drain regions monotonically decreases in a thickness direction of the semiconductor layer at least partly toward said insulating surface,
   wherein said extending parts of the thicker portion and said thinner portions have first surfaces being in contact with said semiconductor layer and second surfaces being in contact with said interlayer insulating film,
   wherein said at least one electrode extends through said interlayer insulating film and said thinner portion of said insulating film.

2. A device according to claim 1 wherein said impurity comprises at least one of phosphorus and boron.

3. A device according to claim 2 wherein said first and second LDD regions contain said impurity at a concentration lower than said source and drain regions.

4. A device according to claim 2 wherein said source and drain regions become n-type when said impurity is phosphorous and said source and drain regions become p-type when said impurity is boron.

5. A device according to claim 1 wherein said gate electrode comprises a doped polysilicon.

6. A device according to claim 1 wherein said insulating film comprises silicon oxide.

7. A device according to claim 1 wherein edges of the thicker portion of the insulating film are substantially aligned with sides of the source and drain regions adjacent to the LDD regions.

8. A device according to claim 7 wherein edges of the gate electrode are substantially aligned with sides of the LDD regions opposite the source and drain regions.

9. A device according to claim 1 wherein said semiconductor layer is a non-single crystalline semiconductor layer.

10. A device according to claim 1 wherein said interlayer insulating film covers whole surfaces of said extending parts of the thicker portion and said thinner portions.

11. A device according to claim 1 wherein said source and drain regions are formed throughout a thickness of the semiconductor layer so that a bottom surface of each of said source and drain regions contacts the insulating surface.

12. A device according to claim 1, wherein said insulating film has substantially two thicknesses only.

13. A device according to claim 1, wherein said thicker portion of said insulating film is in contact with said gate electrode at substantially only a bottom portion thereof.

14. A device according to claim 1, wherein said insulating film comprises a laminated multilayer structure with a plurality of insulating materials each having a different etching rate, respectively.

15. A device according to claim 1, wherein said insulating film and said interlayer insulating film comprise different material, respectively.

16. A device according to claim 1 wherein said thicker portion of said insulating film is 1000 Å thick.

17. A device according to claim 1 wherein said thinner portions of said insulating film are 300 Å thick.

18. A device according to claim 1 wherein a concentration of an impurity doped in said source and drain regions is $1 \times 10^{21}$ atoms cm$^{-1}$.

19. A device according to claim 1 wherein a concentration of an impurity doped in said first and second LDD regions is $6 \times 10^{17}$ atoms cm$^{-1}$.

20. An active matrix display device including a thin film transistor for switching a pixel of said display device, said active matrix display device comprising:
   a substrate having an insulating surface;
   a semiconductor layer formed on said insulating surface, said semiconductor layer including at least a channel region and source and drain regions;
   an insulating film including a gate insulator therein formed on said semiconductor layer and having a thicker portion and thinner portions, wherein said source and drain regions are covered by the thinner portions of the insulating film and introduced with a dopant impurity through said insulating film at a first concentration, and wherein said channel region is covered by the thicker portion of said insulating film, wherein said source and drain regions extend throughout the thickness of the semiconductor layer;
   first and second LDD regions formed between the channel region and the source region and between the channel region and the drain region, wherein said first and second LDD regions are introduced with said dopant impurity through said insulating film, wherein a width of said first LDD region is substantially the same as a width of said second LDD region;

a gate electrode formed on said thicker portion of the insulating film;

an interlayer insulating film formed on said gate electrode and said insulating film;

at least one electrode formed over said interlayer insulating film for contacting at least one of said source and drain regions, wherein said extending parts of the thicker portion extend beyond edges of said channel region and cover said LDD regions, wherein extending parts of the thicker portion and said thinner portions have first surfaces being in contact with said semiconductor layer and second surfaces being in contact with said interlayer insulating film, wherein said at least one electrode extends through said interlayer insulating film and said thinner portion of said insulating film, and wherein a concentration of the dopant impurity contained in said source and drain regions monotonically decreases in a thickness direction of the semiconductor layer at least partly toward said insulating surface.

21. A device according to claim 20 wherein said dopant impurity is introduced into said LDD regions through said thicker portion of said insulating film which covers said LDD regions at a second concentration which is lower than said first concentration.

22. A device according to claim 20 wherein said semiconductor layer is a non-single crystalline semiconductor layer.

23. A device according to claim 20 wherein said interlayer insulating film covers whole surfaces of said extending parts of the thicker portion and said thinner portions.

24. A device according to claim 20 wherein said source and drain regions are formed throughout a thickness of the semiconductor layer so that a bottom surface of each of said source and drain regions contacts the insulating surface.

25. A device according to claim 20, wherein said insulating film has substantially two thicknesses only.

26. A device according to claim 20, wherein said insulating film comprises a laminated multilayer structure with a plurality of insulating materials each having a different etching rate.

27. A device according to claim 20, wherein said insulating film and said interlayer insulating film comprise different material, respectively.

28. A device according to claim 20 wherein said thicker portion of said insulating film is 1000 Å thick.

29. A device according to claim 20 wherein said thinner portions of said insulating film are 300 Å thick.

30. A device according to claim 20 wherein a concentration of said dopant impurity in said source and drain regions is $1 \times 10^{21}$ atoms cm$^{-1}$.

31. A device according to claim 20 wherein a concentration of said dopant impurity in said first and second LDD regions is $6 \times 10^{17}$ atoms cm$^{-3}$.

32. An active matrix display device including a thin film transistor, said active matrix display device comprising:

a substrate having an insulating surface;

a semiconductor layer formed on said insulating surface;

an insulating film including a gate insulator therein formed on said semiconductor layer, said insulating film including:

a thicker portion located on and completely covering a channel region of said semiconductor layer, and thinner portions located on source and drain regions of said semiconductor layer, wherein said source and drain regions extend throughout a thickness of the semiconductor layer;

a gate electrode formed on the thicker portion of said insulating film;

first and second LDD regions formed in said semiconductor layer between the channel region and the source region and between the channel region and the drain region below extending parts of the thicker portion of said insulating film, said extending parts of the thicker portion extending beyond edges of the gate electrode, wherein a width of said first LDD region is substantially the same as a width of said second LDD region;

an interlayer insulating film formed on said insulating film and said gate electrode; and at least one electrode formed over said interlayer insulating film for contacting at least one of said source and drain regions, wherein said extending parts of the thicker portion and said thinner portions have first surfaces being in contact with said semiconductor layer and second surfaces being in contact with said interlayer insulating film, wherein said at least one electrode extends through said interlayer insulating film and said thinner portion of said insulating film, and wherein a concentration of an impurity contained in said source and drain regions monotonically decreases in a thickness direction of the semiconductor layer at least partly toward said insulating surface.

33. A device according to claim 32 wherein said semiconductor layer is a non-single crystalline semiconductor layer.

34. A device according to claim 32 wherein said interlayer insulating film covers whole surfaces of said extending parts of the thicker portion and said thinner portions.

35. A device according to claim 32 wherein said source and drain regions are formed throughout a thickness of the semiconductor layer so that a bottom surface of each of said source and drain regions contacts the insulating surface.

36. A device according to claim 32, wherein said insulating film has substantially two thicknesses only.

37. A device according to claim 32, wherein said insulating film comprises a laminated multilayer structure with a plurality of insulating materials each having a different etching rate.

38. A device according to claim 32, wherein said insulating film and said interlayer insulating film comprise different material, respectively.

39. A device according to claim 32 wherein said thicker portion of said insulating film is 1000 Å thick.

40. A device according to claim 32 wherein said thinner portions of said insulating film are 300 Å thick.

41. A device according to claim 32 wherein a concentration of said impurity doped in said source and drain regions is $1 \times 10^{21}$ atoms cm$^{-1}$.

42. A device according to claim 32 wherein a concentration of an impurity doped in said first and second LDD regions is $6 \times 10^{17}$ atoms cm$^{-3}$.

43. A device according to claim 32, wherein the thin film transistor is used for switching a pixel of a liquid crystal display or a bit of an image sensor.

* * * * *